United States Patent
Perdoor et al.

(10) Patent No.: US 9,608,801 B2
(45) Date of Patent: Mar. 28, 2017

(54) PROGRAMMABLE FREQUENCY DIVIDER PROVIDING A FIFTY-PERCENT DUTY-CYCLE OUTPUT OVER A RANGE OF DIVIDE FACTORS

(71) Applicant: Aura Semiconductor Pvt. Ltd, Bangalore (IN)

(72) Inventors: Sandeep Perdoor, Bangalore (IN); Vaibhav Maheshwari, Bangalore (IN); Augusto Marques, Bangalore (IN)

(73) Assignee: AURA SEMICONDUCTOR PVT. LTD, Bangalore (IN)

( * ) Notice: Subject to any disclaimer, the term of this patent is extended or adjusted under 35 U.S.C. 154(b) by 0 days.

(21) Appl. No.: 15/046,448

(22) Filed: Feb. 18, 2016

(65) Prior Publication Data

US 2017/0005786 A1 Jan. 5, 2017

(30) Foreign Application Priority Data

Jul. 2, 2015 (IN) .......................... 3361/CHE/2015

(51) Int. Cl.
*H04L 7/033* (2006.01)
*H03L 7/197* (2006.01)
(Continued)

(52) U.S. Cl.
CPC ......... *H04L 7/0331* (2013.01); *H03K 21/026* (2013.01); *H03K 21/38* (2013.01);
(Continued)

(58) Field of Classification Search
CPC ....... H04L 7/0331; H03L 7/08; H03L 7/0992; H03L 7/18; H03L 7/193; H03K 21/00; H03K 23/68; H03K 23/667; G06F 7/68
See application file for complete search history.

(56) References Cited

U.S. PATENT DOCUMENTS 5,371,772 A 12/1994 Al-Khairi
6,707,326 B1 * 3/2004 Magoon .................... G06F 7/68
327/115

(Continued)

FOREIGN PATENT DOCUMENTS

EP 1346479 B1 8/2004
EP 2562938 A1 2/2013
WO 0252727 A1 7/2002

OTHER PUBLICATIONS

Zhang Song-Wei and Zhao Cheng, Design for realizing arbitrary fractional divider based on FPGA which duty cycle is up to 50%, http://www.atlantis-press.com/php/download_paper.php?id=5758, Atlantis Press, Paris, France, 2013, pp. 1-4.

(Continued)

*Primary Examiner* — Jean B Corrielus
(74) *Attorney, Agent, or Firm* — IPHorizons PLLC; Narendra Reddy Thappeta

(57) ABSTRACT

A divider circuit determines whether an input factor (N) is an even number or an odd number. If N is an even number then the input clock is divided by N/2 to generate an intermediate clock. The intermediate clock is further divided by two to generate a div-by-2 clock, which is provided as the output clock with fifty percent duty cycle. If N is an odd number, the input clock is divided by (N/2−0.5) in a first duration and by (N/2+0.5) in a second duration to generate the intermediate clock, which is then divided by two to generate the div-by-2 clock. A delayed clock is generated from the div-by-2 clock, wherein the delayed clock lags the div-by-2 clock by half cycle duration of the input clock. The div-by-2 clock and the delayed clock are combined to generate the output clock with fifty percent duty cycle.

20 Claims, 13 Drawing Sheets

(51) Int. Cl.
  *H03K 21/02*  (2006.01)
  *H03K 21/38*  (2006.01)
  *H03L 7/089*  (2006.01)
  *H03L 7/099*  (2006.01)
  *H03L 7/183*  (2006.01)

(52) U.S. Cl.
  CPC ............ *H03L 7/0891* (2013.01); *H03L 7/099* (2013.01); *H03L 7/183* (2013.01); *H03L 7/1974* (2013.01); *H03L 7/1976* (2013.01)

(56) References Cited

U.S. PATENT DOCUMENTS

| | | | |
|---|---|---|---|
| 6,998,882 | B1 | 2/2006 | Chung |
| 7,042,257 | B2 | 5/2006 | Wang |
| 7,521,972 | B2 | 4/2009 | Wilson et al. |
| 2005/0088210 | A1* | 4/2005 | Chen ............ H03K 23/68 327/115 |
| 2006/0203954 | A1* | 9/2006 | Panpalia ........ H03K 23/68 377/47 |
| 2013/0002319 | A1* | 1/2013 | Yeo ............. H03K 23/52 327/157 |

OTHER PUBLICATIONS

L. Romano, S. Levantino, S. Pellerano, C. Samori and A. Lacaita, Low Jitter Design of a 0.35 μm-CMOS Frequency Divider Operating up to 3GHz, http://citeseerx.ist.psu.edu/viewdoc/download-?doi=10.1.1.12.5856&rep=rep1&type=pdf, ESSCIRC 2002, pp. 611-614.

M. Jurgo, K. Kiela and R. Navickas, Design of Low Noise 10 GHz divide-by-16 . . . 511 Frequency Divider, http://dx.doi.org/10.5755/j01.eee.19.6.4570, Elektronika IR Elektrotechnika, ISSN 1392-1215, vol. 19, No. 6, 2013, pp. 87-90.

Mohit Arora, Clock Dividers Made Easy, http://ar.newsmth.net/att/f115b1581222f/Clock_divder_made_easy.pdf., SNUG Boston, 2002, pp. 1-19.

Gao Haijun, Sun Lingling, Cai Chaobo and Zhan Haiting, Pulse swallowing frequency divider with low power and compact structure, http://www.jos.ac.cn/bdtxben/ch/reader/create_pdf.aspx?file_no=12040901, Journal of Semiconductors vol. 33, No. 11, Nov. 2012, pp. 115004-1 to 115004-4.

Michael Perrott, Short Course on Phase-Locked Loops and Their Applications Day 2, PM Lecture, http://wenku.baidu.com/view/362e6f6eb84ae45c3b358c3e.html, Aug. 12, 2008, pp. 1-97.

Michael Perrott, 6.976 High Speed Communication Circuits and Systems Lecture 14 High Speed Frequency Dividers, http://ocw.mit.edu/courses/electrical-engineering-and-computer-science/6-976-high-speed-communication-circuits-and-systems-spring-2003/lecture-notes/lec14.pdf, Massachusetts Institute of Technology, Copyright © 2003, pp. 1-46.

LMK01801 Dual Clock Divider Buffer, http://www.tl.com.cn/cn/lit/ds/symlink/lmk01801.pdf, Texas Instruments Incorporated, Copyright © 2012-2013, pp. 1-51.

* cited by examiner

PROGRAMMABLE FREQUENCY DIVIDER PROVIDING A FIFTY-PERCENT DUTY-CYCLE OUTPUT OVER A RANGE OF DIVIDE FACTORS

PRIORITY CLAIM

The instant patent application claims priority from co-pending India provisional patent application entitled, "FRACTIONAL-N FEEDBACK DIVIDER (DIVN) AND INTEGER-N FEEDFORWARD DIVIDER (DIVO)", Application Number: 3361/CHE/2015, Filed: 2 Jul. 2015, naming as inventors Perdoor et al, and is incorporated in its entirety herewith, to the extent not inconsistent with the content of the instant application.

BACKGROUND

Technical Field

Embodiments of the present disclosure relate generally to frequency dividers, and specifically to a programmable frequency divider providing a fifty-percent duty-cycle output over a range of divide factors.

Related Art

A frequency divider receives a periodic input signal and generates a periodic output signal with a frequency that is less than or equal to the frequency of the input signal. The ratio of the frequency of the output signal to that of the input signal is referred to as the divide factor, and is normally an integer. The divide factor may be programmable (i.e., selectable) via corresponding input(s) to the frequency divider, and a frequency divider may be designed to support a range of divide factors from a lowest limit to a highest limit.

The duty cycle of a periodic signal is generally the ratio of the active duration (e.g., duration of logic high) to the period of the periodic signal. It may be desirable that the duty cycle of the output signal of a programmable frequency divider be (a fixed) fifty-percent for all divide factors in the supported range of divide factors, irrespective of the specific frequencies of the input or output signals.

Several aspects of the present disclosure are directed to a programmable frequency divider providing a fifty-percent duty-cycle output over a range of divide factors.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A divider circuit provided according an aspect of the present disclosure first determines whether an input factor (N) is an even number or an odd number. If the input factor (N) is an even number then the input clock is divided by N/2 to generate an intermediate clock. The intermediate clock is further divided by a factor of 2 to generate a div-by-2 clock, which is provided as the output clock.

On the other hand if the input factor (N) is an odd number, the frequency of the input clock by (N/2−0.5) in a first duration and by (N/2+0.5) in a second duration to generate the intermediate clock. The intermediate clock is divided by a factor of 2 to generate the div-by-2 clock. A delayed clock is generated from the div-by-2 clock, wherein the delayed clock lags the div-by-2 clock by half cycle duration of the input clock. The div-by-2 clock and the delayed clock are combined to generate the output clock.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example Device

Figure 1:
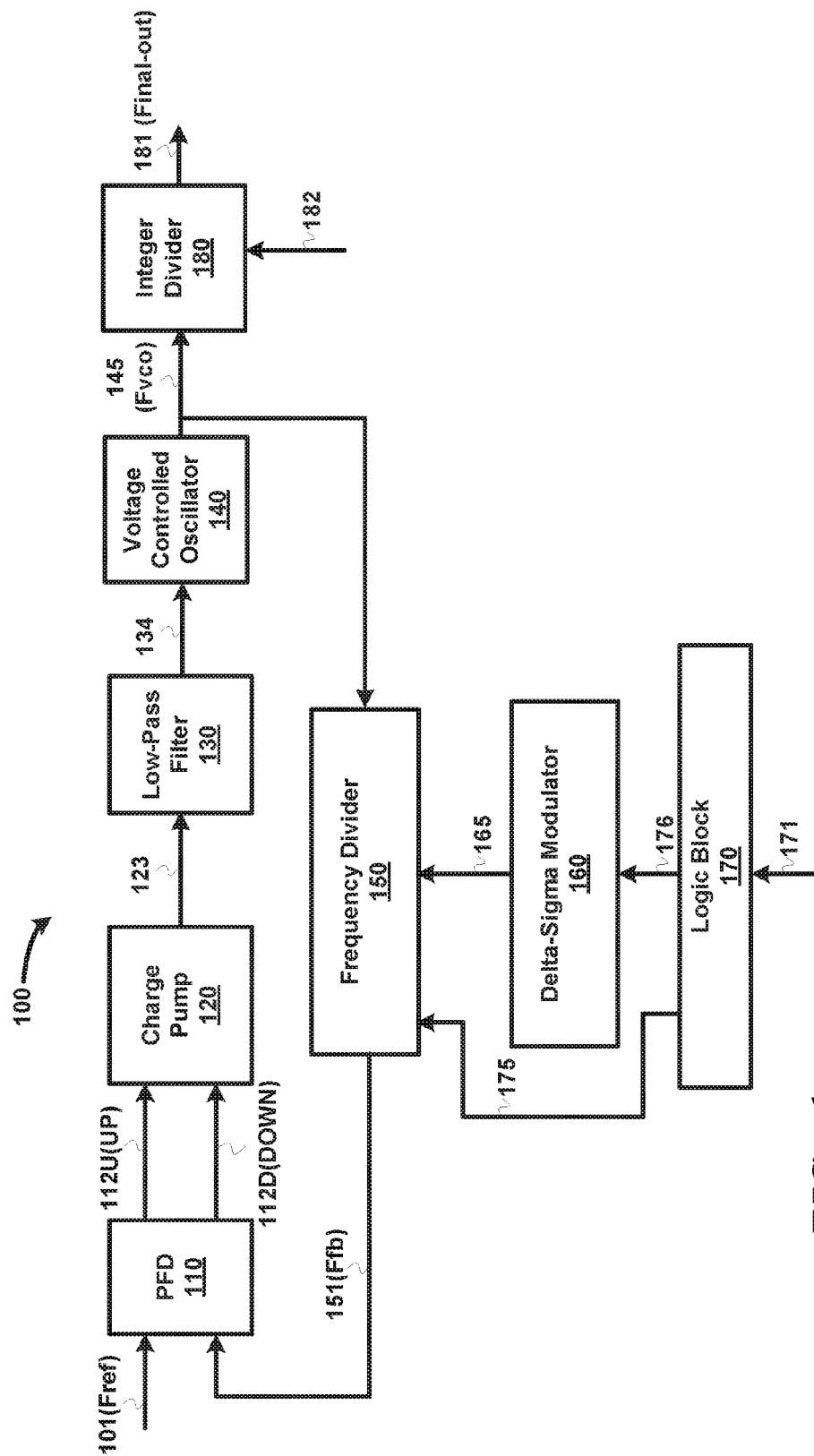
FIG. 1 is a block diagram of an example device in which several aspects of the present disclosure can be implemented.

FIG. 1 is a block diagram of an example device in which a frequency divider implemented according to several aspects of the present disclosure can be used. Phase locked loop (PLL) 100 (which can be used as a frequency synthesizer) of FIG. 1 is shown containing phase frequency detector (PFD) 110, charge pump 120, low-pass filter (LPF) 130, voltage controlled oscillator (VCO) 140, frequency divider 150, delta-sigma modulator (DSM) 160, logic block 170 and integer divider 180. PLL 100 may be implemented as an integer-only PLL or a fractional PLL (as noted below), and may be implemented in integrated circuit (IC) form. It must be understood that while implementation of frequency divider 150 as described below may provide several advantages in the context of a PLL, frequency divider 150 may also be deployed as a stand-alone unit, or in other contexts as well.

It is first noted that each of frequency divider 150 and integer divider 180 operates to divide the frequency of a corresponding input clock to generate an output clock. For the sake of clarity, the number by which frequency divider 150 divides its input clock (Fvco) is termed 'divide ratio', while the number by which integer divider 180 divides its input clock (also Fvco) is termed 'divide factor'. Further, frequency divider 150, being in the feedback path of PLL 100, may be viewed as a 'feedback' divider. Integer divider 180 may be viewed as a 'feedforward' divider.

VCO 140 generates an output signal Fvco (VCO clock) on path 145, with the frequency of Fvco being determined by the (instantaneous) magnitude of voltage received on path 134.

Frequency divider 150 receives Fvco as an input, divides the frequency of Fvco by a divide ratio, and provides the frequency-divided signal as a feedback signal Ffb on path 151.

Logic block 170 receives a user input (e.g., from a user or a processing block, not shown) on path 171, with the user input representing the number by which Fvco is to be divided to generate Ffb. When PLL 100 is implemented as a fractional PLL, block 170 forwards the fractional portion of the user input (on path 171) to DSM 160 on path 176, and the integer portion of the number (on path 171) to frequency divider 150 on path 175. DSM 160 generates (in one of several known ways) a sequence of divide values corresponding to (or representing) the fractional part. DSM 160 forwards the numbers in the sequence successively (one number per cycle of reference frequency 101, with the sequence repeating after the last number in the sequence is forwarded) to frequency divider 150 on path 165. Frequency divider 150 determines the divide ratio per cycle (i.e., the divide ratio to be obtained in each cycle) of reference frequency 101 by adding the inputs received (on paths 175 and 165) corresponding to the cycle. Alternatively, such addition may be performed in a separate block, not shown, which would then provide the sum to frequency divider 150. Thus, when fractional division of Fvco is desired, frequency divider 150 successively divides Fvco by values in a sequence, such that the effective average frequency of Ffb equals the desired fraction of Fvco. When PLL 100 is implemented as an integer-only PLL, DSM 160 is not implemented, and block 170 forwards the integer number received on path 171 to frequency divider 150 on path 175, the integer number itself representing the divide ratio. In an alternative embodiment, the input received on path 171 represents a desired output frequency (for Fvco), and block 170 computes the corresponding divide ratio based on input 171.

PFD 110 receives as inputs, a reference frequency Fref on path 101 and feedback signal Ffb on path 151, and operates to generate error signals UP and DOWN on respective paths 112U and 112D. The ON (active) durations of error signals UP and DOWN are proportional to the amount of phase by which Fref leads or lags Ffb respectively. Reference frequency Fref may be generated by an oscillator (not shown) contained within PLL 100, or provided external to PLL 100.

Charge pump 120 converts the UP and DOWN outputs of PFD 110 to charge (provided on path 123). Path 123 may be single-ended or differential, depending on whether charge pump 120 is designed to provide a single-ended or differential output. While signals UP and DOWN have been noted as being applied to charge pump 120, signals derived from UP and /DOWN (e.g., logical inverse of the signals) may instead be applied to charge pump 120 depending on the specific design of charge pump 120. LPF 130 is a low-pass filter and rejects frequency variations at node 123 above a certain cut-off limit. LPF 130 converts the low-pass-filtered charge to a voltage 134. VCO 140 generates Fvco with a frequency that is dependent on the magnitude of voltage.

Integer divider 180 receives a divide factor (also referred to as 'input factor (N)' herein, which is an integer) on path 182 (which may, for example, be provided by a user or a processing block, not shown) and Fvco on path 145 as inputs, and generates a final output clock 181 (Final-out) whose frequency equals the frequency of Fvco divided by the divide factor. Integer divider 180 may be designed to support a range of divide factors. It may desirable that integer divider 180 provide Final-out with a duty cycle of 50%, irrespective of the divide factor. Several aspects of the present disclosure are directed to such an integer divider, as described in detail below. However, the building blocks used to implement integer divider 180 are first described next.

3. Frequency-Dividing Unit

Figure 2A:
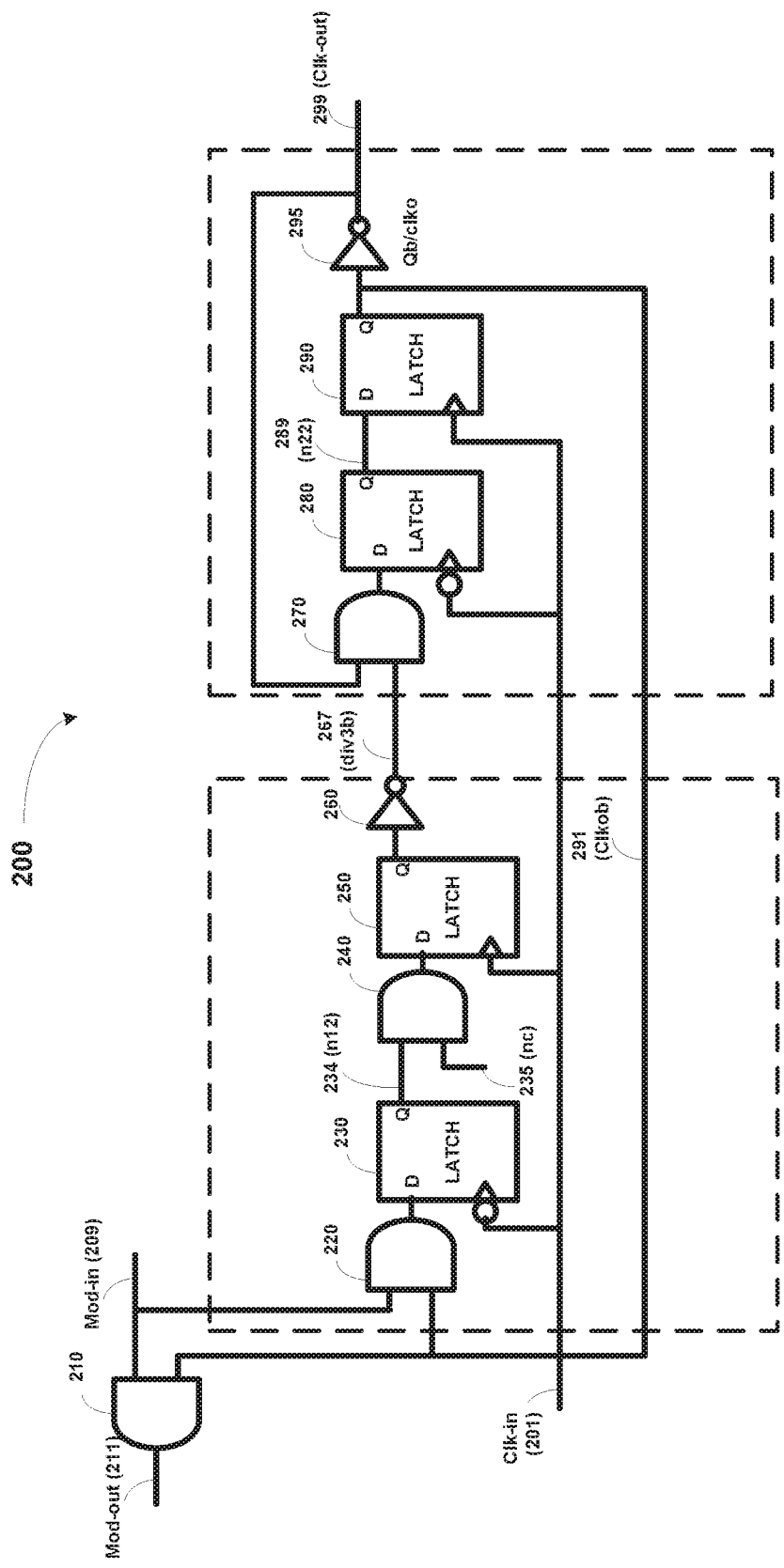
FIG. 2A is a block diagram of a frequency-dividing unit that is used to build a frequency divider, in an embodiment of the present disclosure.

FIG. 2A is a block diagram of a frequency-dividing unit that is used in building an integer divider (e.g., 180) according to aspects of the present disclosure. Two or more of such units as unit 200 of FIG. 2A may be cascaded (connected in series) to obtain an integer divider which supports a desired range of divide factors. In the embodiment of FIG. 2A, frequency-dividing unit 200 is a divider which can divide an input signal by 2 or 3, as controlled by corresponding signals, described below. Only a brief description of unit 200 (with reference also to the timing diagram of FIG. 2B) is provided herein, as the design of such unit is well-known in the relevant arts. For more details of unit 200, the reader is referred to the MIT OPEN COURSEWARE lecture notes identified as "6.976 High Speed Communication Circuits and Systems, Lecture 14, High Speed Frequency Dividers" By Michael Perrott, Massachusetts Institute of Technology.

Frequency-dividing unit 200 is shown containing AND gates 210, 220, 240 and 270, latches 230, 250, 280 and 290, and inverters 260 and 295. Frequency-dividing unit 200 receives an input signal Clk-in (201), and generates an output signal Clk-out (299) whose frequency is either half, or one-third of the frequency of Clk-in. Other signals shown in FIG. 2A and/or FIG. 2B include nc (235) and Mod-in (209), Mod-out (211), n12 (234), div3b (267), n22 (289) and clkob (291). Nc is a control signal (binary signal) provided as input to frequency-dividing unit 200, and which determines if frequency-dividing unit 200 is to be allowed to divide by 3 at all (or divide by 2 only). Mod-in is a mode control signal received from another unit (not shown), and determines when (i.e., at what time instant) frequency-dividing unit 200 is to divide by 3. Mod-out (211) is a mode control signal generated by frequency-dividing unit 200, and may be connected as an input to a previous stage (not shown). The other signals noted above are signals internal to frequency-dividing unit 200.

Figure 2B:
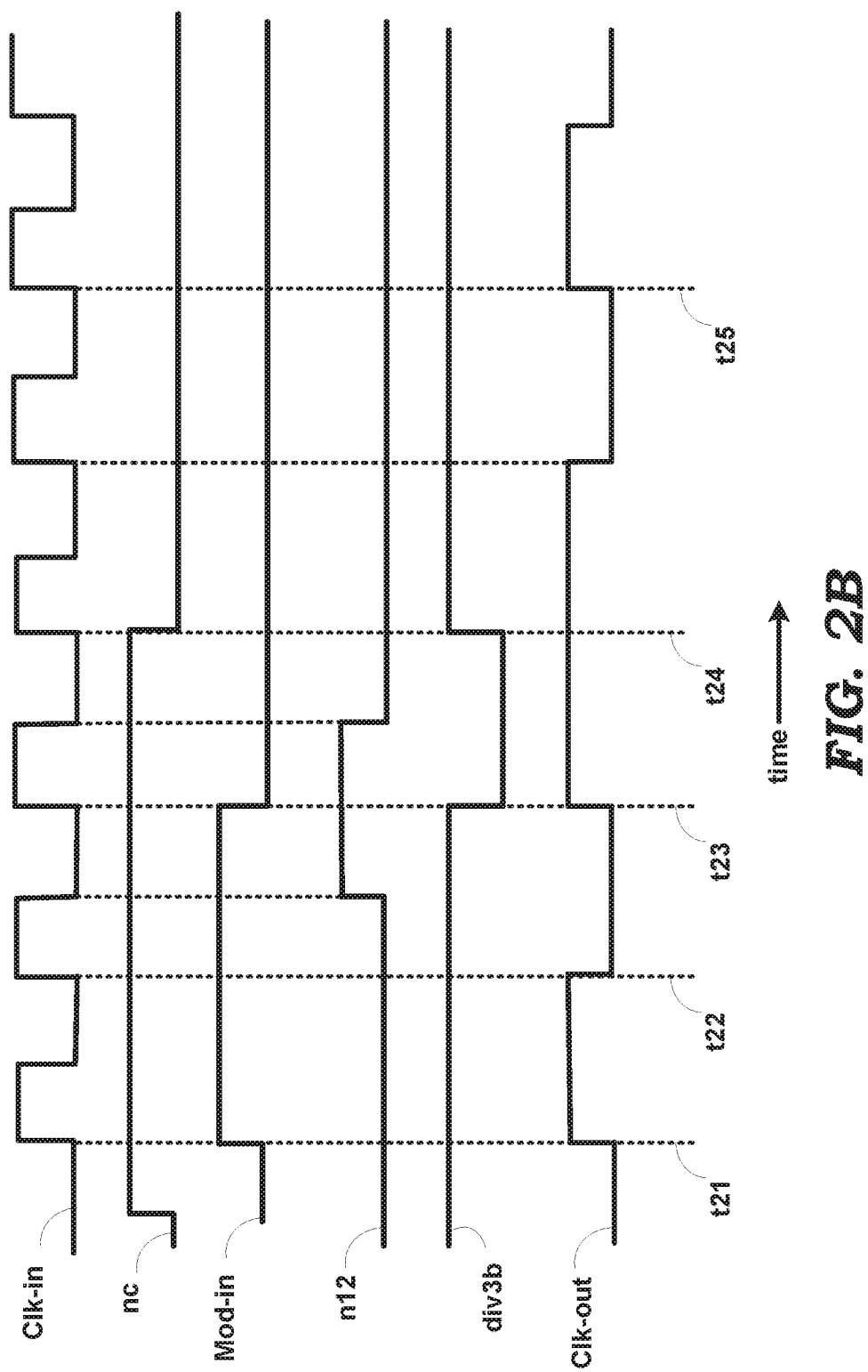
FIG. 2B is a timing diagram illustrating the operation of a frequency-dividing unit used in an embodiment of the present disclosure.

As may be observed from FIG. 2B, in the interval t21 to t23, frequency-dividing unit 200 operates as a divide-by-2 unit, while in the interval t23 to t25 frequency-dividing unit 200 operates as a divide-by-3 unit. In interval t22-t23, signals nc and Mod-in are high, and cause frequency-dividing unit 200 to divide by 3 in the interval between t23 and t25. Mod-in transitions to logic low at t23, and thereafter, nc transitions to logic low at t24 and remains at logic low. In response, frequency-dividing unit 200 operates as a divide-by-2 unit from t25. By appropriate control of nc and Mod-in, frequency-dividing unit 200 can be made to operate as a divide-by-2 or divide-by-3 unit.

By connecting multiple ones of units such as a frequency-dividing unit 200 in series (i.e., in a cascade), corresponding ranges of divide factors between an input signal and an output signal are achieved. As an example, a cascade of three units such as frequency-dividing unit 200 forming a frequency divider 300 is shown in FIG. 3A, and the timing diagram of 3B shows the corresponding waveforms when a divide factor of 15 is desired.

Figure 3A:
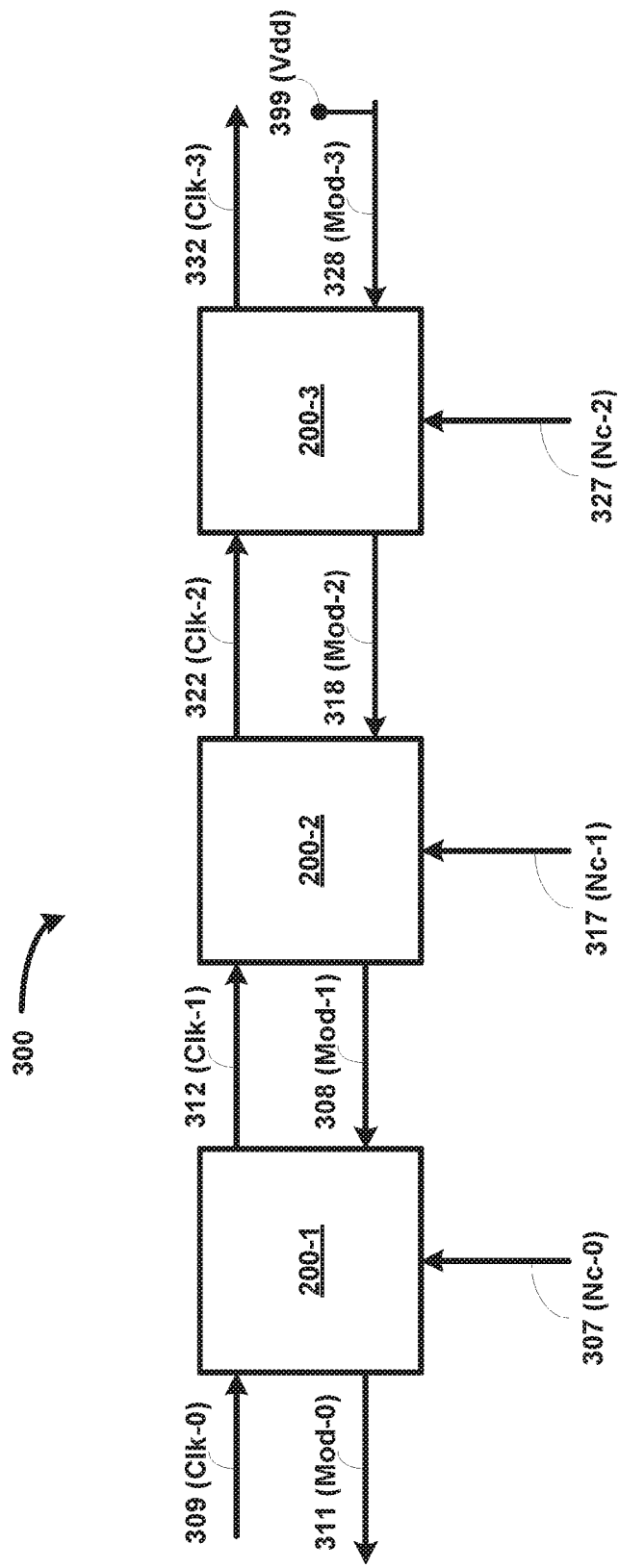
FIG. 3A is a block diagram of a frequency divider built using a cascade of three frequency-dividing units, in an embodiment of the present disclosure.

In FIG. 3A, three units, each identical to frequency-dividing unit 200, are used in a cascade. Clk-0 (309) is the input signal, and is provided as input to the first unit 200-1. Unit 200-1 receives as input a mode control signal 308 (Mod-1) from the next (higher) stage (or unit) 200-2, and a control signal 307 (Nc-0). Depending on the value of Nc-0, unit 200-1 performs only divide-by-2 division or divide-by-3 once in a divide cycle (explained below) and divide-by-2 the rest of the divide cycle. Unit 200-1 provides a divided clock Clk-1 (312) and a mode control signal 311 (Mod-0) as outputs.

Unit 200-2 receives Clk-1 (312) as an input clock. Unit 200-2 receives as input a mode control signal 318 (Mod-2) from the next (higher) stage 200-3, and a control signal 317 (Nc-1). Depending on the value of Nc-1, unit 200-1 performs only divide-by-2 division or divide-by-3 once in a divide cycle and divide-by-2 the rest of the divide cycle. Unit 200-2 provides a divided clock Clk-2 (322) and mode control signal 308 (Mod-1) as outputs.

Unit 200-3 receives Clk-2 (322) as an input clock. Unit 200-3, being the 'highest' unit, the mode control signal 328 (Mod-3) provided as input to unit 200-3 is tied to logic high. Unit 200-3 receives a control signal 327 (Nc-2). Depending on the value of Nc-2, unit 200-3 performs only divide-by-2 division or divide-by-3 once in a divide cycle and divide-by-2 the rest of the divide cycle. Unit 200-3 provides a divided clock Clk-3 (332) and mode control signal 318 (Mod-2) as outputs. Control signals Nc-0, Nc-1 and Nc-2, each of which is a binary signal, may be received from a unit external to divider 300 (and based on user inputs, for example), and their values determine the specific divide factor to be used by divider 300. Input terminals 307, 317 and 327 together represent the "divide input" of divider 300. Unit 200-1 is the 'lowest' (first) unit, while 200-3 is the 'highest' unit.

Figure 3B:
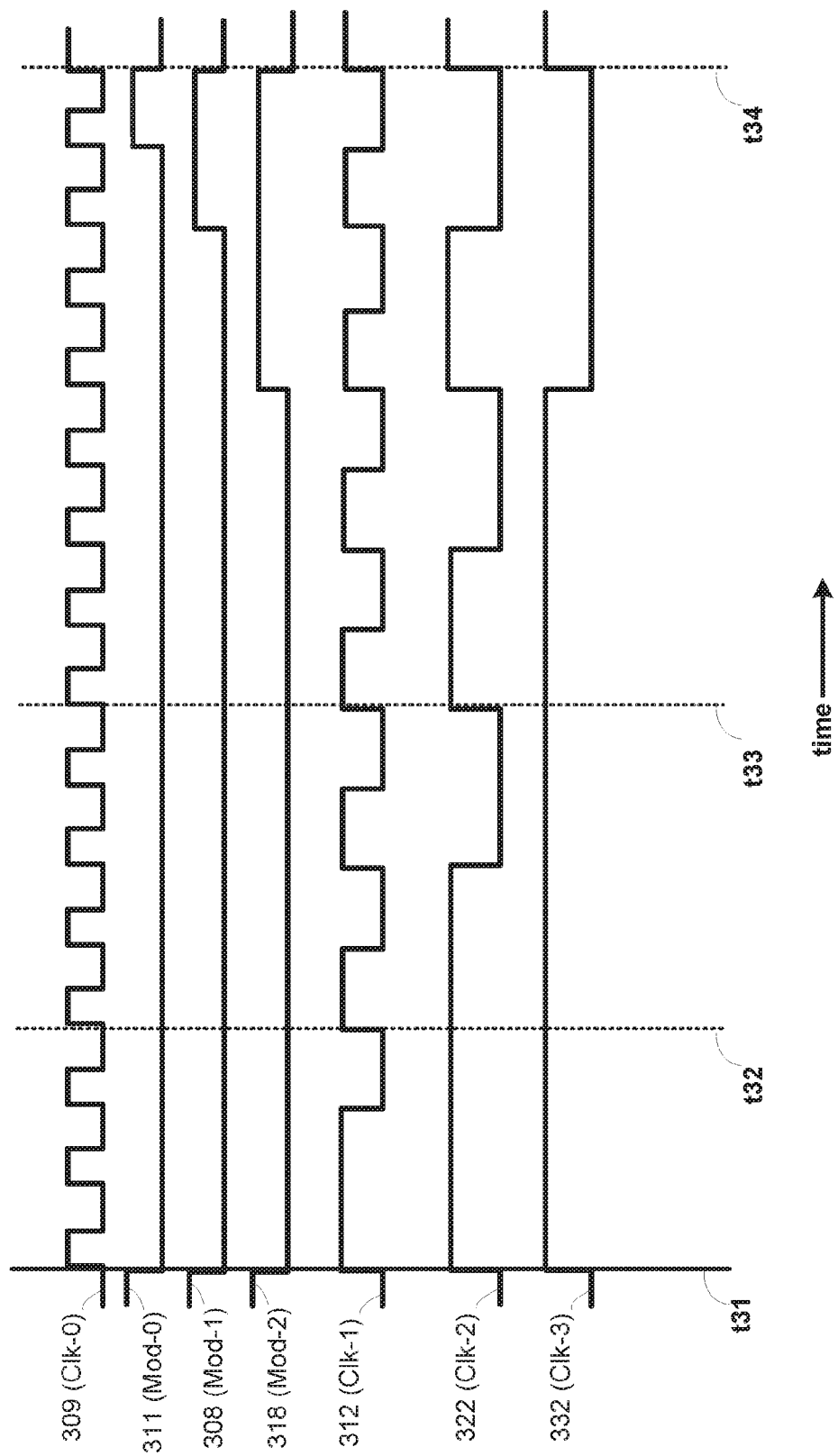
FIG. 3B is a timing diagram illustrating the operation of a frequency divider in an embodiment of the present disclosure.

Referring to FIG. 3B, a 'divide cycle' refers to the duration of one cycle of the clock output of the highest operative unit (the term highest operative unit is clarified in sections below). Thus, in the example of FIGS. 3A and 3B, a divide cycle is the duration t31 to t34, also equal to one period of Clk-3 (332). In the example of FIG. 3A, it is assumed that each of Nc-0, Nc-1 and Nc-2 is set to logic high (one). Therefore, each of stages/units 200-1, 200-2 and 200-3 divides-by-3 once in a divide cycle. Clk-1 (312) divides-by-3 in interval t31-t32, Clk-2 (322) divides-by-3 in interval t31-t33, and Clk-3 always divides by 3. The values for the waveforms shown in FIG. 3B repeat after t34. Clk-3 (332) has a frequency that is ⅕ of that of Clk-1. The general expression that specifies the divide factors that can be obtained by divider 300 is: $[2^3+(Nc-2)\,2^2+(Nc-1)\,2^1+(Nc-0)\,2^0]$. By appropriate selection of Nc-2, Nc-1 and Nc-0, a divide factor in the range 8 to 15 (both inclusive) can be obtained. In general, with a cascade of 'k' units/stages, a range of $[2^k, 2^{k+1}-1]$ can be obtained.

Figure 4:
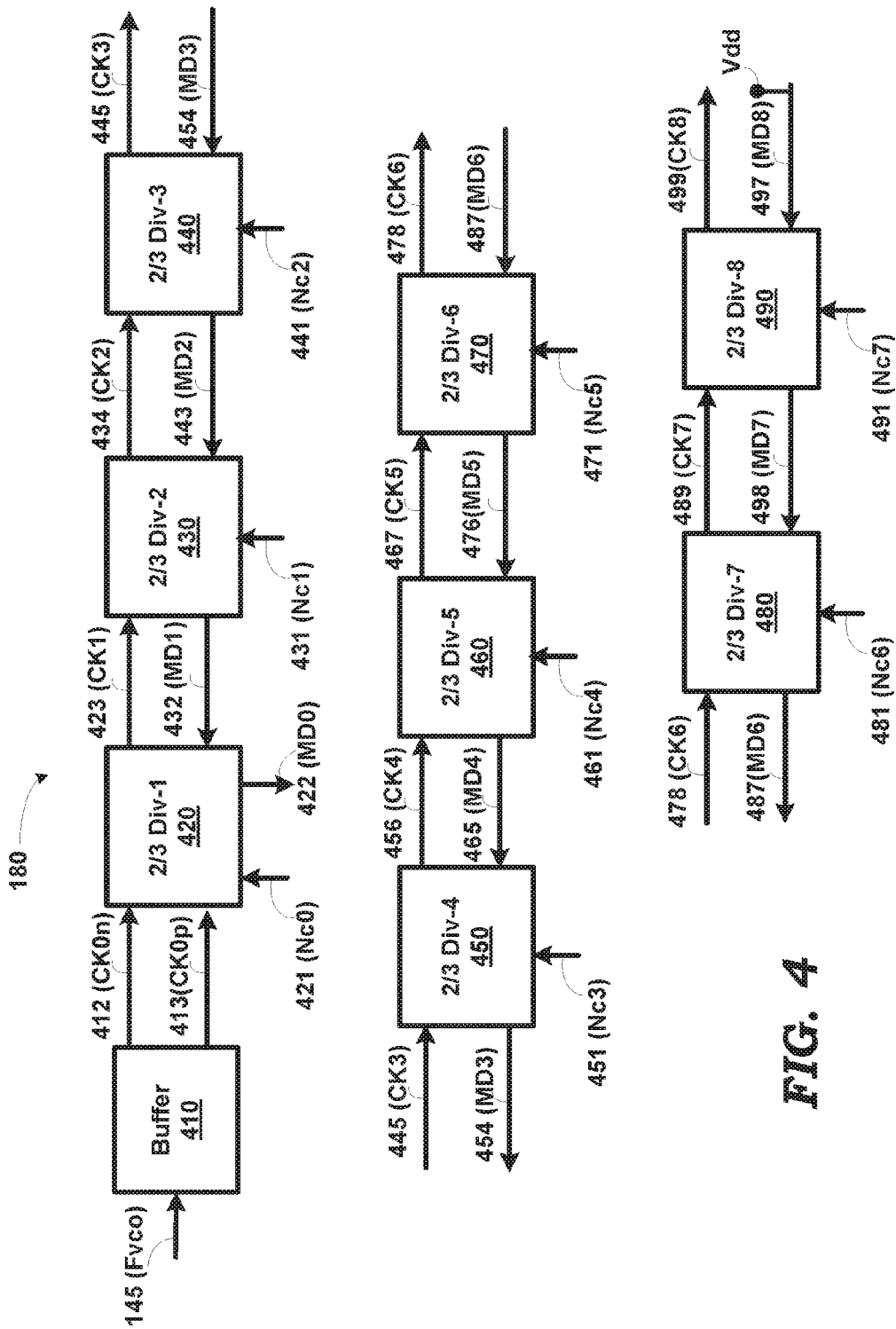
FIG. 4 is a block diagram of a frequency divider built using a cascade of eight frequency-dividing units, in an embodiment of the present disclosure.

Thus, for example with eight cascaded stages (and assuming all eight stages are operated), a divide range of [256, 511] can be obtained, and such a cascade is illustrated in FIG. 4. In FIG. 4 are shown buffer 410, and divide-by-⅔ units 420 through 490 (each identical to frequency-dividing unit 200 of FIG. 2) contained in integer divider 180, in an embodiment of the present disclosure.

Buffer 410 receives Fvco (145 in FIG. 1) which represents the input signal whose frequency is to be divided by a desired divide factor. Buffer 410 provides additional drive to Fvco, and generates a corresponding differential signal CK0n/CK0p (across terminals 412 and 413), and which has the same frequency as Fvco. Each of units 420-490 receives a corresponding clock signal, control signal (nc) and a mode control signal as inputs, and generates a divided clock signal and a mode control signal. The corresponding connections are shown in FIG. 4, and are briefly summarized below.

Figure 8A:
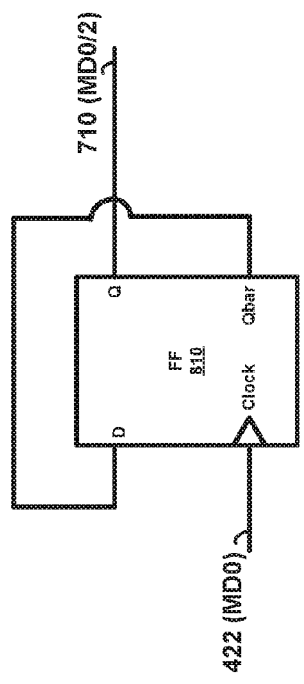
FIG. 8A is a diagram of a divide-by-2 circuit, used in an integer divider in an embodiment of the present disclosure.

Unit 420 receives Ck0n (412) and Ck0p (413) as an input clock. Unit 420 receives as input a mode control signal 432 (MD1) from the next higher stage unit 430, and a control signal 421 (Nc0). Depending on the value of Nc0, unit 420 performs only divide-by-2 division or divide-by-3 once in a divide cycle and divide-by-2 the rest of the divide cycle. Unit 420 provides a divided clock CK1 (423) and mode control signal 422 (MD0) as outputs. The rest of the units operate similarly, with signals 434 (CK2), 445 (CK3), 456 (CK4), 467 (CK5), 478 (CK6), 489 (CK7) and 499 (CK8) being the respective clock output signals of units 430, 440, 450, 460, 470, 480 and 490, and which are provided as inputs to the corresponding next higher unit. Units 430-490 receive respective control signals 431 (Nc1), 441 (Nc2), 451 (Nc3), 461 (Nc4), 471 (Nc5), 481 (Nc6) and 491 (Nc7). Units 430-490 receive respective mode control signals 443 (Md2), 454 (MD3) 465 (MD4), 476 (MD5), 487 (MD6), 498 (MD7) and 497 (MD8). Input terminals 421, 431, 441, 451, 461, 471, 481 and 491 together represent the "divide input" of integer divider 180. Control signals Nc0 through Nc7, each of which is a binary signal, is generated by logic unit 850 of FIG. 8C. Logic unit 850 receives input factor N on path 182, determines whether N is even or odd, and generates signals Nc0 through Nc7 with corresponding binary values (representing a corresponding derived divide factor) based on whether the N is odd or even (further described below). Logic unit 850 may be designed in a known way.

In FIG. 4, MD8 (497) is shown tied to logic high (Vdd/power supply). This implies that all the divide units 420-490 are operational (i.e., powered-ON and used in operation of integer divider 180), with 420 being the first unit and 490 being the highest unit. Since eight units are used, the possible divide range is [256, 511]. If divide factors less than 256 are also desired (in addition to the range [256, 511], one or more of the higher units need to be switched off (or not used even if powered-ON), and the resulting highest (rightmost in the cascade of units) mode control signal should be tied to logic high. To illustrate, assuming only the first seven units 420-480 are operated, with unit 490 switched off (or not used), then MD7 (498) needs to be tied to logic high. With such an arrangement a divide range of [128, 255] is obtained.

Similarly, with only the first six units (420 through 470) operational (480 and 490 being switched off or not used), then MD6(487) is tied to logic high. With such an arrangement a divide range of [64, 127] is obtained. Similarly, with only the first five units (420 through 460) operational (470, 480 and 490 being switched off or not used), MD5 (476) is tied to logic high. With such an arrangement a divide range of [32, 63] is obtained. In the example of FIG. 4 and the corresponding timing diagram of FIG. 5 (described below), it is assumed that integer divider 180 is designed to support (only) a range of [32, 511], 32 being the lowest divide factor (lowest limit) and 511 being the highest divide factor (highest limit) that frequency divider is designed to provide. It may be noted that by extending the same logic as above, even lower values of divide factors may be obtained. However, it is assumed herein that integer divider 180 is designed to only provide the range [32, 511], and various portions of integer divider 180 may be fixed by design to support only that range.

Figure 5:
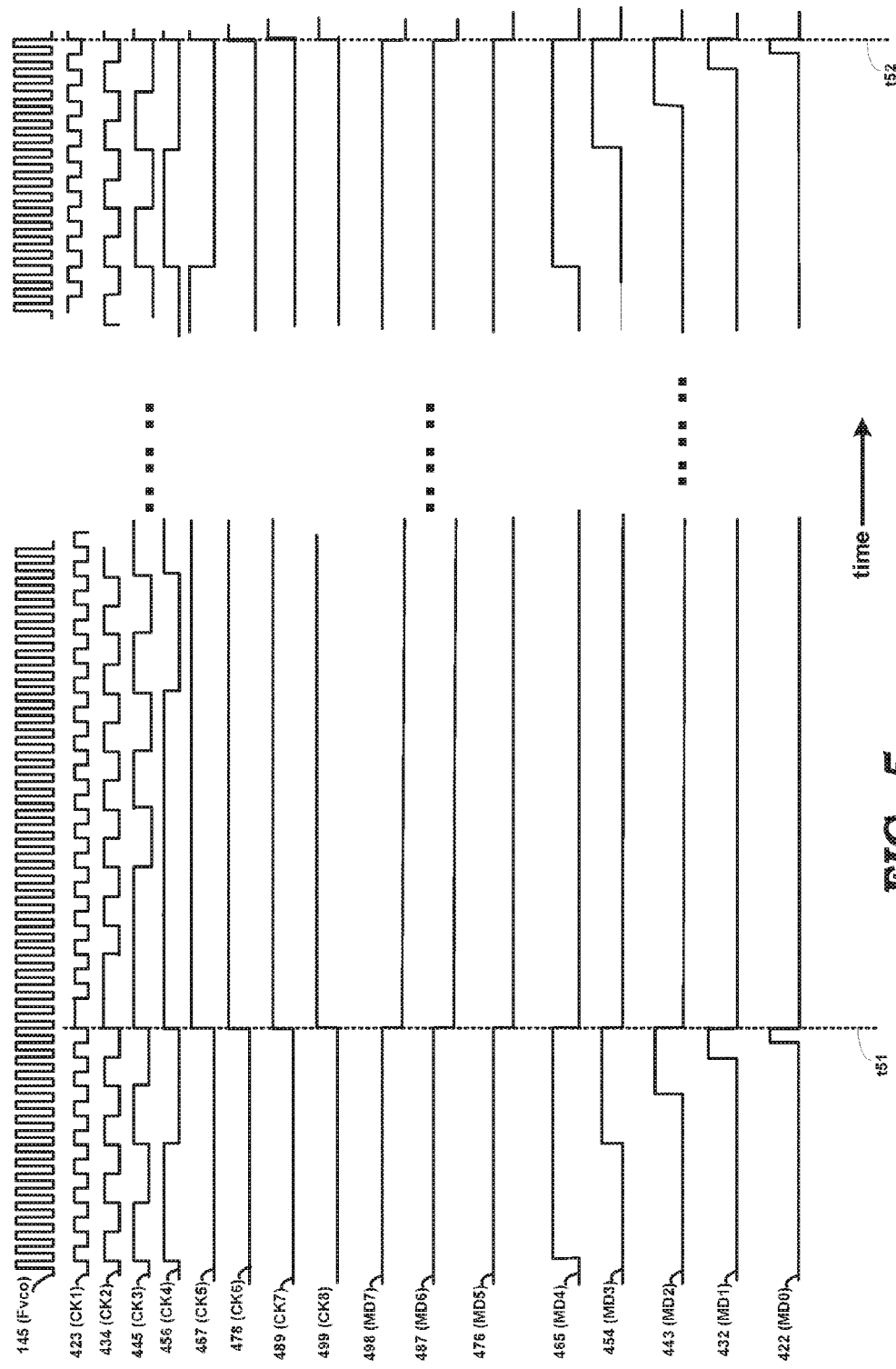
FIG. 5 is a timing diagram illustrating the operation of a frequency divider in another embodiment of the present disclosure.

FIG. 5 is a timing diagram illustrating waveforms at various nodes of integer divider 180 implemented as shown in FIG. 4, for some arbitrary large value of divide factor. CK8 (499) has the desired frequency Fvco/divide factor (although not shown clearly in FIG. 5). Each of the mode control signals MD0-MD7 also has a frequency that equals (Fvco/divide factor). However, the duty cycle of none of CK8 and MD0-MD7 is guaranteed to equal to 50%. As noted above, it may be desirable to provide the final output clock 181 of PLL 100 with a duty-cycle of fifty-percent. For example, the circuit/component receiving Final-out (181) may be designed such that it can operate correctly only if Final-out has a fifty-percent duty cycle. A fifty-percent duty cycle for Final-out (181) may also be required by standards to which PLL 100 may be required to comply with.

According to an aspect of the present disclosure, rather than using the divide factor directly (i.e., rather than dividing Fvco directly by the divide factor), a pair of 'derived' divide factors are used to successively (and repeatedly) divide the frequency of Fvco. The values of the pair depend on whether the divide factor (182) is odd or even. The resulting MD0 is then further processed to generate Final-out 181 with a duty cycle equal to 50% irrespective of the value of the divide factor. The description is continued next with an illustration of the manner in which such 50% duty cycle for Final-out is achieved.

4. Achieving Fifty-Percent Duty Cycle

Figure 6:
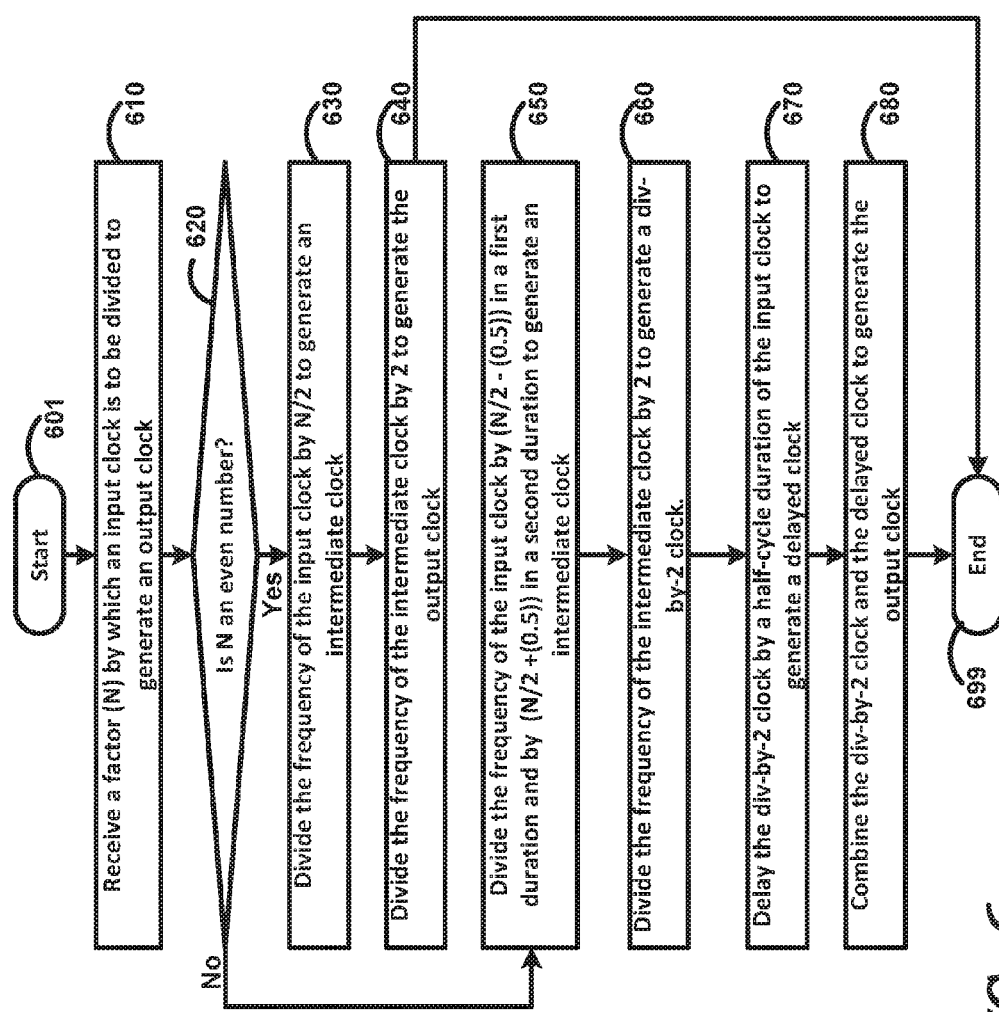
FIG. 6 is a flow chart illustrating the manner in which the frequency of an input clock is divided to obtain an output clock with a fifty-percent duty cycle, in an embodiment of the present disclosure.

FIG. 6 is a flow chart illustrating the manner in which the frequency of an input clock is divided to obtain an output clock with a fifty-percent duty cycle irrespective of the divide factor, in an embodiment of the present disclosure. The flowchart is described with respect to FIG. 1, in particular, integer divider 180, merely for illustration. However, many of the features can be implemented in other environments also without departing from the scope and spirit of several aspects of the present disclosure, as will be apparent to one skilled in the relevant arts by reading the disclosure provided herein.

In addition, some of the steps may be performed in a different sequence than that depicted below, as suited to the specific environment, as will be apparent to one skilled in the relevant arts. Many of such implementations are contemplated to be covered by several aspects of the present disclosure. The flow chart begins in step 601, in which control immediately passes to step 610.

In step 610, integer divider 180 receives an input factor (N) by which input clock (Fvco) is to be divided. The input factor is an integer. In the embodiment of FIG. 1, the input factor (N) is received on path 182. Control then passes to step 620.

In step 620, integer divider 180 determines if N is an even integer or odd integer. If N is an even integer, control passes to step 630. If N is an odd integer, control passes to step 650.

In step 630, integer divider 180 divides the frequency of the input clock by N/2 in each of a first duration and a second duration to generate an intermediate clock. The second duration starts immediately after the end of the first duration. The first duration and the second duration repeat, with integer divider 180 continuously repeating the division by N/2 in each of the corresponding first and second durations. Thus, the two 'derived' divide factors are each N/2. The division results in the generation of an intermediate clock. Control then passes to step 640.

In step 640, integer divider 180 divides the frequency of the intermediate clock by a factor of two to generate final-out (181), which may be viewed as the output clock of PLL 100. Control then passes to step 699, in which the flowchart ends.

In step 650, integer divider 180 divides the frequency of the input clock by (N/2−(0.5)) in a first duration, and by (N/2+(0.5)) in a second duration. The second duration starts immediately after the end of the first duration. The first duration and the second durations repeat, with integer divider 180 continuously repeating the division by (N/2−(0.5)) and (N/2+(0.5)) in the respective first and second durations. Thus, the two 'derived' divide factors are (N/2−(0.5)) and (N/2+(0.5)). The division results in the generation of an intermediate clock. Although integer divider 180 is noted above as dividing first by (N/2−(0.5)) and then by (N/2+(0.5)), the sequence can also be flipped. i.e., integer divider 180 can divide by (N/2−(0.5)) in the first duration, and then by (N/2+(0.5)) in the second duration. Control then passes to step 660.

In step 660, integer divider 180 divides the frequency of the intermediate clock by a factor of two to generate a divided-by-two (div-by-2) clock. Control then passes to step 670.

In step 670, integer divider 180 delays the div-by-2 clock (of step 660) by a duration equal to a half-cycle of the input clock (Fvco) to generate a delayed clock. Control then passes to step 680.

In step 680, integer divider 180 combines the div-by-2 clock and the delayed clock to generate the output clock, i.e., Final-out (181). Control then passes to step 699, in which the flowchart ends. While described in terms of a series of successive steps, when implemented in hardware form, one or more of the steps may execute concurrently.

The operations of the flowchart as described above enable integer divider 180 to generate Final-out (181) with a duty-cycle of fifty-percent for all values of N within the range of divide factors supported by the design of integer divider 180, and are illustrated further with examples below.

It is noted first that while any of CK8 and MD0-MD7 can be used (by processing suitably in a manner similar to that described below with respect to MD0), using MD0 to generate Final-out 181 is the best choice when noise in Final-out 181 is of concern. This is because CK8 and MD0-MD7 are generated from FVCO using more logic operations compared to MD0. Generally, noise in a signal is more if more logic operations have to be performed to obtain the signal. Also, MD0 can to be re-synchronized with Fvco 145 before further processing to generate Final-out (181) with fifty-percent duty cycle.

Figure 7A:
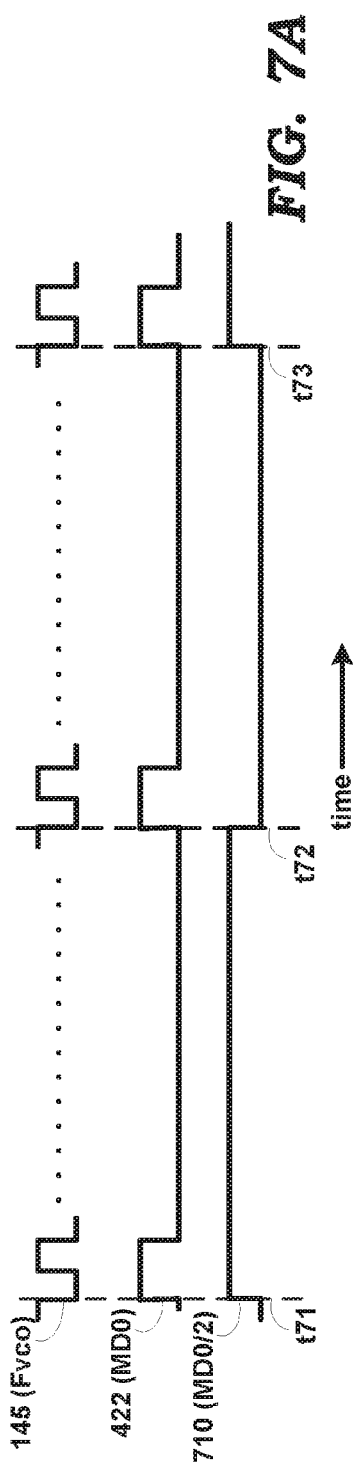
FIG. 7A is a timing diagram illustrating the manner in which an integer divider provides a fifty-percent duty cycle output when the divide factor is even, in an embodiment of the present disclosure.
Figure 7B:
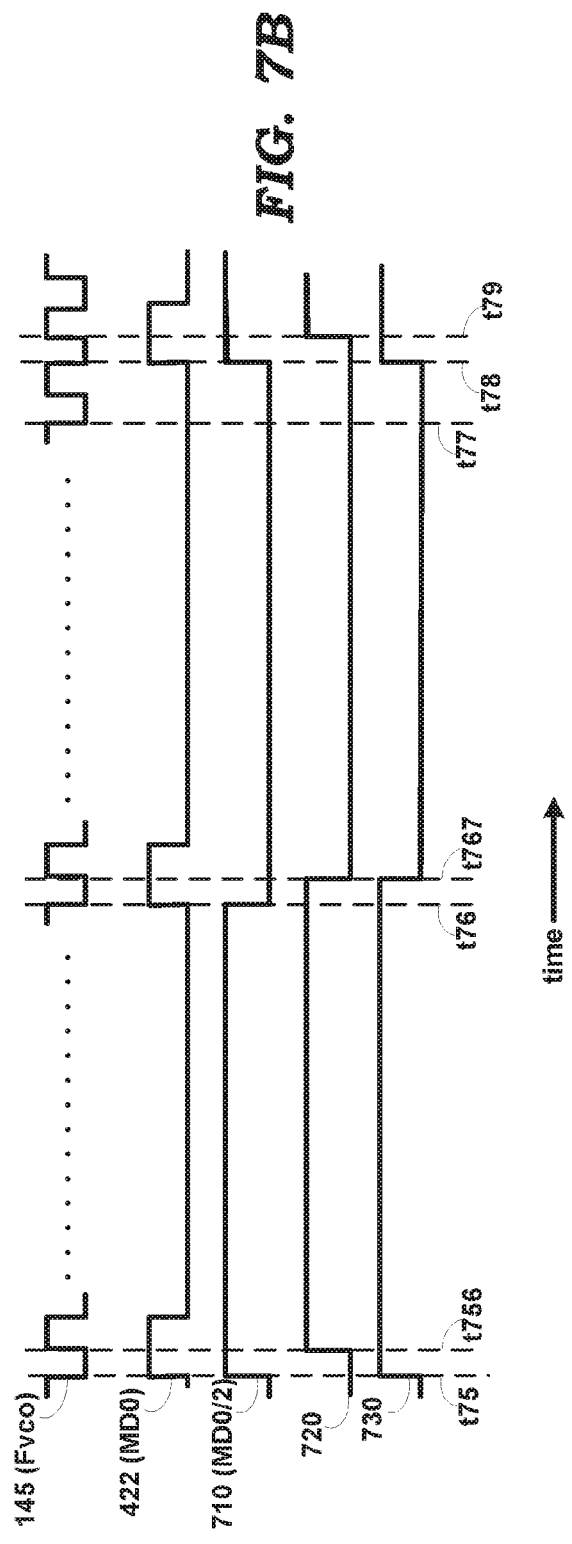
FIG. 7B is a timing diagram illustrating the manner in which an integer divider provides a fifty-percent duty cycle output when the divide factor is odd, in an embodiment of the present disclosure.
Figure 8B:
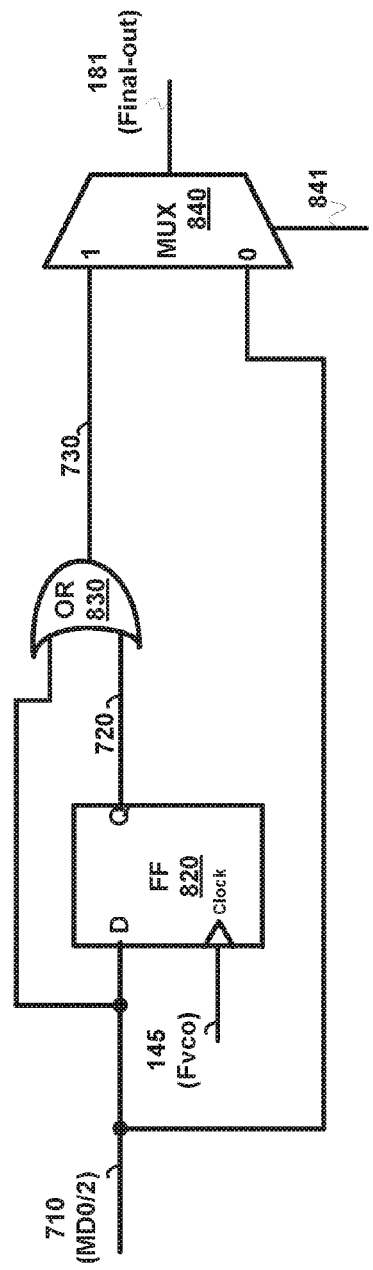
FIG. 8B is a block diagram of a portion in an integer divider that is used to generate an output clock with fifty-percent duty cycle, in an embodiment of the present disclosure.
Figure 8C:
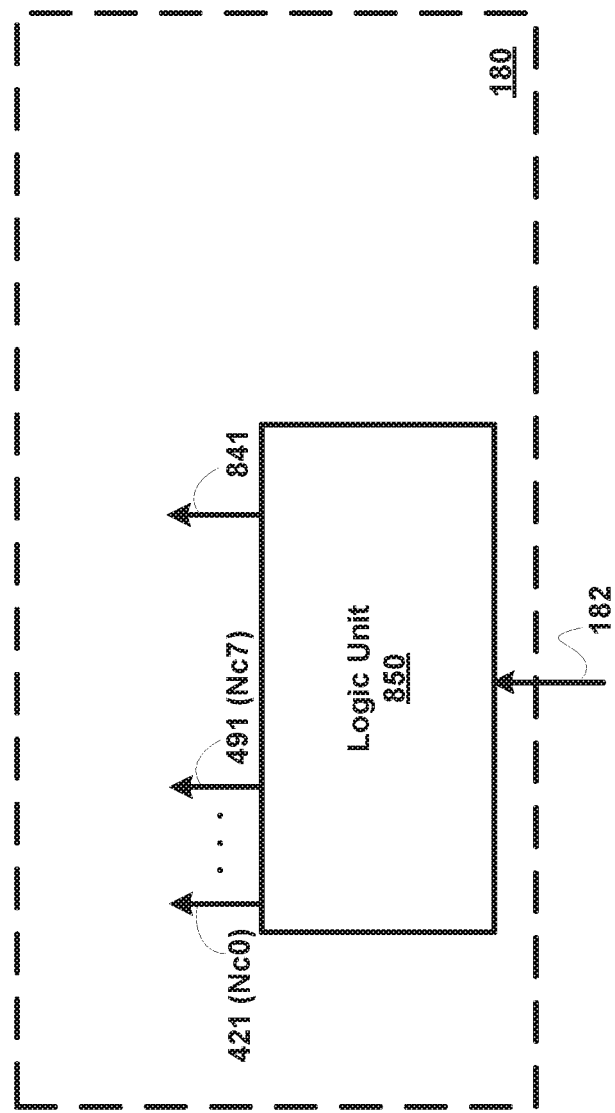
FIG. 8C is a block diagram illustrating the manner in which control signals are provided to frequency-dividing units of an integer divider in an embodiment of the present disclosure.

It is also noted that in FIG. 7A and FIG. 7B (as well as FIG. 5), the edges of MD0 (422) are shown as coinciding with falling edges of Fvco. However, depending on the specific hardware implementation of integer divider 180, edges of MD0 (422) may instead coincide with rising edges of Fvco. When edges of MD0 (422) coincide with falling edge of Fvco, then FF 820 of FIG. 8B (described below) is implemented as a rising-edge triggered flip flop. However, when the implementation is such that edges of MD0 (422) coincide with falling edge of Fvco, FF 820 of FIG. 8B is implemented instead as a falling-edge triggered flip-flop. Further, it is noted here that while Fvco is indicated in the Figures as being single-ended, Fvco may also be implemented as a differential signal. When Fvco is implemented as a differential signal, then Fvco-p and Fvco-n represent the positive and negative nodes of Fvco. The waveform at Fvco-n is the same as that of Fvco shown in the Figures, and the waveform at Fvco-p is the inverse of that at Fvco-n.

FIG. 7A is a timing diagram illustrating corresponding waveforms when the divide factor N (received on path 182) is an even integer. As an example, assuming N equals 100, then a logic unit 850 in integer divider 180 programs Nc0 through Nc4 (of FIG. 4) with corresponding binary values to cause integer divider 180 to divide by 50 (i.e., N/2) for 50 cycles of Fvco. Units 470, 480 and 490 of FIG. 4 are non-operative or unused for a divide by 50. In FIG. 7A, the duration from t71 to t72 represents 50 cycles of Fvco. Since integer divider 180 divides by 50 in interval t71-t72 (one 'first duration'), one cycle of MD0 is obtained in interval t71-t72, as may be observed from FIG. 7A.

Since N is even, integer divider 180 does not change the settings of Nc0 through Nc4 for a 'second duration' t72-t23. It may be observed from FIG. 7A that the second duration t72-t73 immediately follows the first duration (t71-t72). Integer divider 180 divides Fvco again by 50 (i.e., N/2) for the next 50 cycles of Fvco, and another cycle of MD0 is obtained in the second interval. Thus, the two derived divide factors when N is even are the same (50 in the example). The first duration and second duration are repeated, with integer divider 180 set to divide by 50 in each of the durations. MD0, thus generated, may be viewed as an 'intermediate clock', and is provided to a divide-by-2 circuit. FIG. 8A shows one well-known implementation of a divide-by-2 circuit. Flip-flop (FF) 810 has its data (D) input connected to Qbar (logical complement of output Q of FF 810). The clock input of FF 810 is connected to MD0. The output (Q) of FF 810 provides a 'divided-by-2' (div-by-2) clock MD0/2 (710). Therefore, MD0/2 (710) has a frequency that is 1/100 that of Fvco. When N is even, MD0/2 is provided as the output clock (i.e., Final-out (181)) of integer divider 180.

FIG. 7B is a timing diagram illustrating corresponding waveforms when the divide factor (N) (received on path 182) is an odd integer. As an example, assuming N equals 101, then logic unit 850 in integer divider 180 programs Nc0 through Nc4 (FIG. 4) with corresponding binary values to cause integer divider 180 to divide by 50 (i.e., N/2−(0.5)) for one divide cycle. In FIG. 7B, the duration from t75 to t76 represents 50 cycles of Fvco. Since integer divider 180 divides by 50 in interval t75-t76 (one 'first duration'), one cycle of MD0 (422) is obtained in interval t75-t76.

Logic unit 850 in integer divider 180 then programs Nc0 through Nc4 (FIG. 4) with corresponding binary values to cause integer divider 180, starting at t76, to divide by 51 (i.e., N/2+(0.5)) for one divide cycle. Thus, integer divider 180 divides Fvco by 51 for the next 51 cycles of Fvco, and another cycle of MD0 (422) is obtained in interval t76-t78 second interval. Interval t76-t77 represents 50 cycles of Fvco, and interval t77-t78 represents once cycle of Fvco. Thus, the two derived divide factors when N is odd are unequal (50 and 51 in the example). The first duration and second duration are repeated, with integer divider 180 set to divide by 50 in each of the first durations and by 51 in each of the second durations. MD0 is provided to a divide-by-2 circuit (such as of FIG. 8A, for example) to obtain MD0/2 (710).

It may be observed that the duty cycle of MD0/2 (as in FIG. 7B) when N is odd does not equal 50%. Therefore, a 'delayed' clock (720) derived from MD0/2 (710), and delayed by half-clock cycle duration of Fvco with respect to MD0/2 (710), is generated. The delayed clock (720) and the intermediate clock (MD0/2) (710) are combined (representing a logical OR function) to generate clock 730 having 50% duty-cycle, which is then provided as output clock (Final-out 181) of integer divider 180.

FIG. 8B is a block diagram of a circuit implemented within integer divider 180 to generate Final-out (181) from MD0/2 (710), in an embodiment of the present disclosure. The diagram is shown containing flip-flop (FF) 820, OR gate 830 and multiplexer (MUX) 840. MD0/2 (710) is provided to the input (D) of FF 820. Fvco is provided to the clock input of FF 820. FF 820 is a negative edge-triggered flip-flop. Delayed clock 720 is generated at the output (Q) of FF 820.

OR gate 830 receives MD0/2 and delayed clock 720 as inputs, and provides, on path 730, the result of a logical OR operation on the two inputs. It should be appreciated that the logical OR operation represents an example approach to combining MD0/2 and delayed clock 720, and various other alternative approaches will be apparent to one skilled in the relevant arts by reading the disclosure provided herein. It may be further appreciated that OR gate 830 represents a combining circuit realized in the form of a logic gate.

MUX 840 receives the signal on path 730 and MD0/2 (710) as inputs, and forwards the corresponding one of the two inputs as Final-out (181) based on the binary value of a control input received on path 841. Control signal 841 is generated by logic unit 850, based on whether the input factor (N) (received on path 182) is even or odd. It is noted that when integer divider 180 divides Fvco by (N/2+(0.5)) in the first duration, and then by (N/2−(0.5)) in the second duration, OR gate 830 is replaced by a NAND gate (which is another example of a combining circuit), with all other components and connections of FIG. 8B remaining the same.

Thus, the output clock 181 (Final-out) of integer divider 180 is generated to always have a duty-cycle of 50%. It is noted here that, although integer divider 180 is described in the context of a PLL, integer divider 180 may also be deployed as a stand-alone unit (for example, as an integrated circuit), or in combination with other types of devices.

Figure 9:
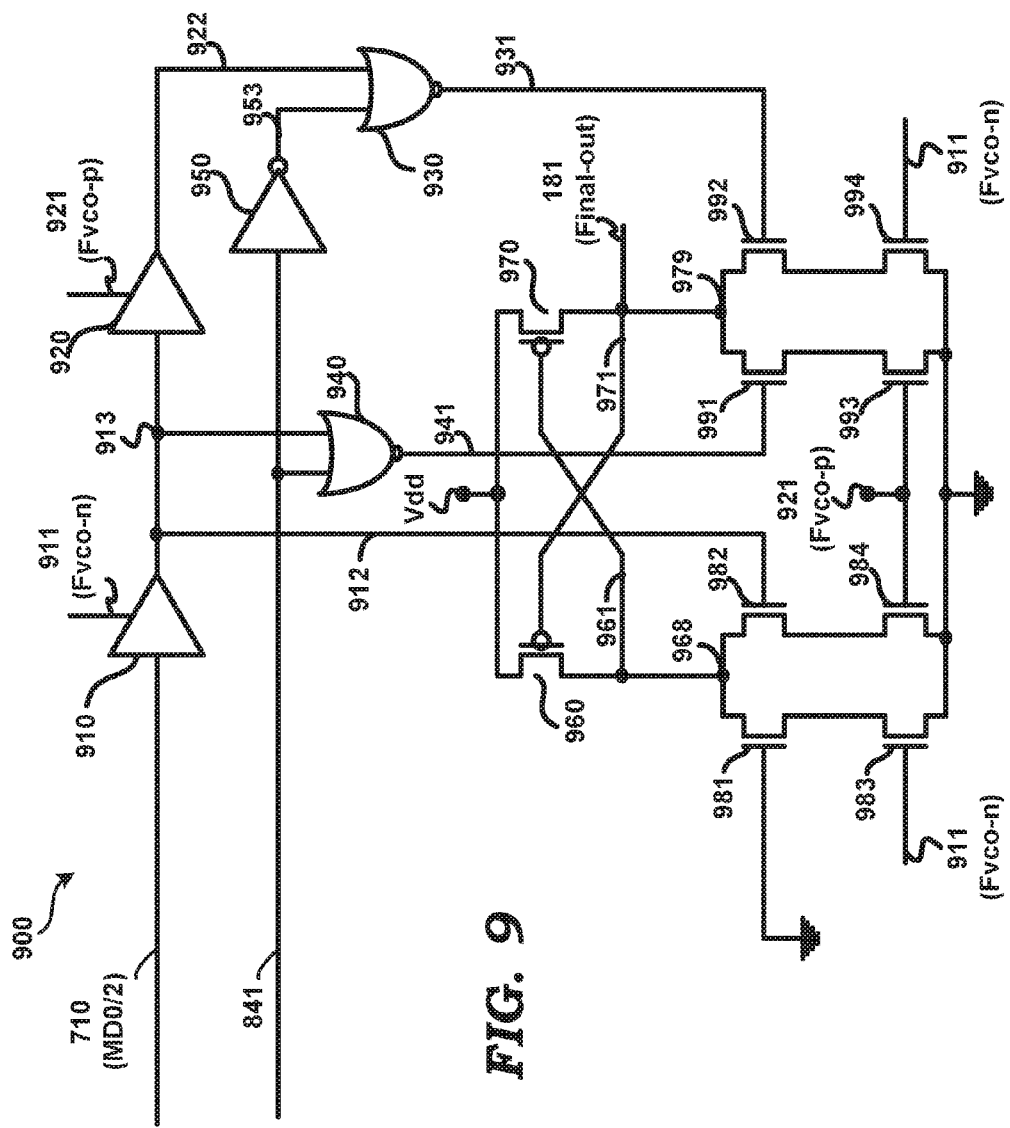
FIG. 9 is a diagram of a portion in an integer divider that is used to generate an output clock with fifty-percent duty cycle, in another embodiment of the present disclosure.

FIG. 9 is a diagram of a circuit implemented within integer divider 180 to generate Final-out (181) from MD0/2 (710), in another embodiment of the present disclosure. FIG. 9 is shown containing flip-flops 910 and 920, NOR gates 930 and 940, and P-type MOS (PMOS transistor 210) transistors 960 and 970, and N-type MOS (NMOS) transistors 981, 982, 983, 984, 991, 992, 993 and 994. It is assumed in the description below that Fvco is implemented as a differential signal, with Fvco-n (911) and Fvco-p (921) representing the negative and positive components of Fvco. As noted above, the waveform at Fvco-n (911) is the same as that of Fvco shown in the figures, and the waveform at Fvco-p 921 is the inverse of that at Fvco-n 911. The gate of NMOS 981 is tied to ground, and hence NMOS 981 is always OFF. Flip-flop 910 is clocked by Fvco-n (911), while flip-flop 920 is clocked by Fvco-p (921). Hence the signal on node 922 is delayed with respect to the signal on node 913 by a duration equal to a half-cycle of MD0/2 (710).

When the divide factor N is even, signal 841 is at logic low (logic zero). As a result, node 953 is at logic high (logic one), node 931 is at logic low, and NMOS 992 is OFF. NOR gate 940 operates as an inverter. The gate terminal of NMOS 982 receives MD0/2, while the gate terminal of NMOS 991 receives the logical inverse of MD0/2. Therefore, node 181 (Final-out) is logically equivalent to MD0/2, as is required when divide factor N is even.

When the divide factor N is odd, signal 841 is at logic high. As a result, node 941 is at logic low, and NMOS 991 is OFF. NOR gate 930 operates as an inverter. The gate terminal of NMOS 982 receives MD0/2, while the gate terminal of NMOS 992 receives a delayed MD0/2 (MD0/2 delayed by half a cycle of Fvco). Final out (181) is provided as the logical OR result of the signals on nodes 912 and 931.

Since Fvco-p is applied to the gate terminals of NMOS 984 and NMOS 994, output Final-out 181 is generated at the active edge (rising edge here) of Fvco-p, and is therefore resynchronized with respect to Fvco. Further, such re-synchronization with respect to Fvco is provided at the final stage of generation of Final-out (181), rather than prior to OR gate 830 and MUX 840, as in the implementation of FIG. 8B. Therefore, the circuit of FIG. 9 provides final-out (181) with less jitter/noise than the implementation of FIG. 8B. Flip-flop 910 is provided to prevent race-around conditions (since Fvco-p is applied for final re-synchronization).

It is to be understood that the specific components and interconnections shown in FIG. 9 are provided merely by way of example, and modifications to the circuit of FIG. 9 would be apparent to one skilled in the relevant arts upon reading the disclosure herein. For example, each of PMOS 960 and 970 can be replaced with resistors, while also removing the cross-coupling connections 961 and 971. Thus, PMOS 960 and 970 may instead be simply viewed as pull-up components that serve to connect each of nodes 968 and 979 to Vdd. As another example, logic gates 940, 950 and 930 can be replaced by other types of logic gates, while also making suitable changes to connections to/from the inputs/outputs of those gates. Similarly, flip-flops 910 and 920 can be replaced by other types of memory elements.

PLL 100 incorporating frequency divider 180 implemented as described above can be used as part of a system as described next.

5. System

Figure 10:
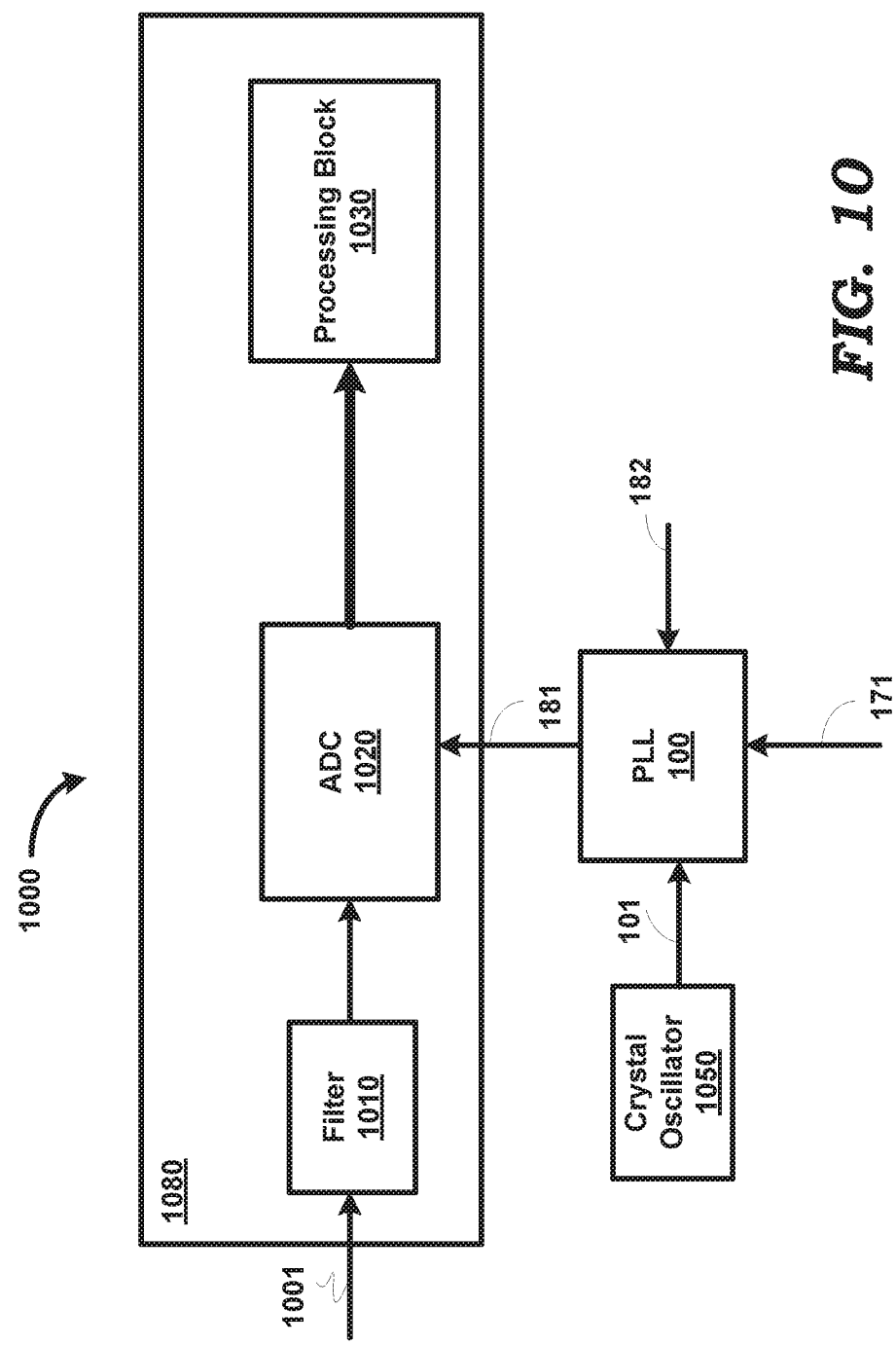
FIG. 10 is a block diagram of a system incorporating a PLL containing an integer divider implemented according to several aspects of the present disclosure.

FIG. 10 is a block diagram of a system in which a PLL with an integer divider (such as 180) implemented according to aspects of the present disclosure can be used. System 1000 is shown containing signal processing block 1080, crystal oscillator 1050 and PLL 100. Signal processing block 1080 is in turn shown containing filter 1010, analog to digital converter (ADC) 1020 and processing block 1030.

Filter 1010, which may be an anti-aliasing filter of system 100, receives an analog signal on path 1001, and provides a filtered signal (low-pass or band-pass filtered) to ADC 1020. ADC 1020 receives a sampling clock on path 181 (Final-out) from PLL 100, and generates digital codes representing the magnitude of the received filter signal at time instances (e.g., rising edges) specified by sampling clock 181. Processing block 1030 receives the digital codes, and processes the digital codes in a desired manner (for example for signal processing applications).

Crystal oscillator 1050 generates reference frequency 101 at a fixed (desired) frequency. PLL 100 receives a divide ratio (integer or fractional) on path 171, and a divide factor on path 182. PLL 100 generates sampling clock 181 at a frequency determined by the divide ratio 171 and reference frequency 101, as well as divide factor 182.

6. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1 through 10, although various pairs of terminals/nodes are shown with direct connections, it should be appreciated that additional components (as suited for the specific environment) may also be present in the path between each pair of terminals/nodes. When there is a current path (with or without additional components) between any pair of terminals/nodes, the pair is said to be "electrically coupled". On the other hand, when a node is "connected to" or "directly connected to" another node (of a pair), it means that there are no intervening components between the pair of nodes, and the two nodes are effectively a single node or the connection between them is an electrical short (zero or very low resistance).

Further, it should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, NMOS transistors and PMOS transistors may be swapped, while also interchanging the connections to power and ground terminals. Accordingly, in the instant application, the power and ground terminals are referred to as constant reference potentials, the source (emitter) and drain (collector) terminals (through which a current path is provided when turned ON and an open path is provided when turned OFF) of transistors are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A method of dividing the frequency of an input clock by an input factor (N) to generate an output clock with a fifty-percent duty cycle, wherein N is an integer other than 0 and 1, said method being performed in a frequency divider circuit, said method comprising:

receiving said input factor (N);

determining if said input factor (N) is an even number or an odd number;

if said input factor (N) is an even number then:

dividing said frequency of said input clock by a first factor to generate an intermediate clock;

dividing said intermediate clock by a factor of 2 to generate a div-by-2 clock; and providing said div-by-2 clock as said output clock,
but if said input factor (N) is an odd number then:
  dividing said frequency of said input clock by a second factor in a first duration and by a third factor in a second duration to generate said intermediate clock, wherein said second duration immediately follows said first duration,
  dividing said intermediate clock by a factor of 2 to generate said div-by-2 clock,
  generating a delayed clock from said div-by-2 clock, wherein said delayed clock lags said div-by-2 clock by half cycle duration of said input clock; and
  combining said div-by-2 clock and said delayed clock to generate said output clock.

2. The method of claim 1, wherein said first factor is (N/2), said second factor is (N/2−(0.5)) and said third factor is (N/2+(0.5)).

3. The method of claim 2, wherein said intermediate clock is one of a mode control output of a unit in a cascade of frequency-dividing units of said frequency divider circuit and a clock output of a highest unit in said cascade of frequency-dividing units, wherein each of said frequency-dividing units is designed to divide either by 2 or 3.

4. The method of claim 2, wherein said intermediate clock is a mode control output of a lowest unit in a cascade of frequency-dividing units of said frequency divider circuit,
  wherein said combining comprises performing a logical OR operation of said delayed clock and said intermediate clock.

5. The method of claim 1, wherein said first factor is (N/2), said second factor is (N/2+(0.5)) and said third factor is (N/2−(0.5)), wherein each of said frequency-dividing units is designed to divide either by 2 or 3,
  wherein said intermediate clock is a mode control output of a lowest unit in a cascade of frequency-dividing units of said frequency divider circuit,
  wherein said combining comprises performing a logical NAND operation of said delayed clock and said intermediate clock.

6. A frequency divider circuit to receive an input clock and to generate an output clock with a frequency equal to the frequency of said input clock divided by an input factor (N), said frequency divider circuit comprising:
  means for receiving said input factor (N), wherein N is an integer other than 0 and 1;
  means for determining if said input factor (N) is an even number or an odd number;
  means for dividing the frequency of said input clock;
  means for dividing an intermediate clock by a factor of 2 to generate a div-by-2 clock;
  means for generating a delayed clock from said div-by-2 clock; and
  means for combining said div-by-2 clock and said delayed clock;
  wherein if said input factor (N) is even:
    said means for dividing the frequency of said input clock divides the frequency of said input clock by a first factor to generate said intermediate clock,
    said means for dividing said intermediate clock divides said intermediate clock by a factor of 2 to generate said div-by-2 clock, wherein said div-by-2 clock is said output clock,
  wherein if said input factor (N) is odd:
    said means for dividing the frequency of said input clock divides the frequency of said input clock by a second factor in a first duration and by a third factor in a second duration to generate said intermediate clock, wherein said second duration immediately follows said first duration,
    said means for dividing said intermediate clock divides said intermediate clock by a factor of 2 to generate said div-by-2 clock,
    said means for generating generates a delayed clock, wherein said delayed clock lags said div-by-2 clock by a half-cycle duration of said input clock; and
    said means for combining combines said div-by-2 clock and said delayed clock to generate said output clock.

7. The frequency divider circuit of claim 6, wherein said first factor is (N/2), said second factor is (N/2+(0.5)) and said third factor is (N/2−(0.5)).

8. The frequency divider circuit of claim 6, wherein said intermediate clock is one of a mode control output of a unit in a cascade of frequency-dividing units of said frequency divider circuit and a clock output of a highest unit in said cascade of frequency-dividing units, wherein each of said frequency-dividing units is designed to divide either by 2 or 3.

9. The frequency divider circuit of claim 7, wherein said intermediate clock is a mode control output of a lowest unit in a cascade of frequency-dividing units of said frequency divider circuit.

10. The frequency divider circuit of claim 9, wherein said means for combining comprises a NAND gate.

11. The frequency divider circuit of claim 10, further comprising a multiplexer (MUX), said MUX coupled to receive the output of said NAND gate and said div-by-2 clock as inputs, said MUX to provide said output of said NAND gate as said output clock if said input factor (N) is odd, said MUX to provide said div-by-2 clock as said output clock if said input factor (N) is even.

12. The frequency divider circuit of claim 6, wherein said first factor is (N/2), said second factor is (N/2−(0.5)) and said third factor is (N/2+(0.5)).

13. The frequency divider circuit of claim 12, wherein said means for combining comprises an OR gate, said frequency divider circuit further comprising a multiplexer (MUX), said MUX coupled to receive the output of said OR gate and said div-by-2 clock as inputs, said MUX to provide said output of said OR gate as said output clock if said input factor (N) is odd, said MUX to provide said div-by-2 clock as said output clock if said input factor (N) is even.

14. A phase locked loop (PLL) comprising:
  a phase frequency detector (PFD) to receive a reference frequency and a feedback frequency, said PFD to generate a first error signal and a second error signal, said first error signal and said second error signal being representative of a phase difference between said reference frequency and said feedback frequency;
  a charge pump coupled to receive each of said first error signal and said second error signal, and to generate a charge;
  a low-pass filter (LPF) coupled to receive said charge, and to convert said charge into a voltage;
  a voltage controlled oscillator (VCO) coupled to receive said voltage, and to generate a VCO clock;
  a feedback divider coupled to receive said VCO clock, and to divide a frequency of said VCO clock to generate said feedback frequency; and
  a feedforward divider coupled to receive said VCO clock, and to divide a frequency of said VCO clock (Fvco) to generate an output clock,
  wherein said feedforward divider comprises:

a logic unit for receiving an input factor (N) and generating, as an output, a derived divide factor based on whether N is even or odd, wherein said input factor is the number by which the frequency of said VCO clock is to be divided, wherein said input factor is an integer other than 0 and 1, wherein said input factor is between a lowest limit and a highest limit;

a cascade of M frequency-dividing units coupled in series, said cascade comprising a lowest unit and a highest unit with the remaining of the M units being disposed between said lowest unit and said highest unit, wherein the highest unit is the Mth unit, and the lowest unit is the first unit in said cascade, the lowest unit being coupled to receive said VCO clock, said cascade comprising a divide input represented by a set of bits, said divide input coupled to receive said output of said logic unit, wherein M is an integer, wherein the range of values by which the frequency of said VCO clock is operable to be divided by said cascade depends on the number of frequency-dividing units of said cascade that are operative, whereby said range of values is a first range if N successive frequency-dividing units of said M units are operative, but a second range, not equal to said first range, if (N-1) frequency-dividing units are operative, wherein each frequency-dividing unit in said cascade comprises:
  a first input for receiving an input clock;
  a first output for providing a local output clock to the next frequency-dividing unit in said cascade;
  a second output for providing a mode control signal to a previous frequency-dividing unit of said cascade; and
  a second input for receiving a corresponding bit in said set of bits, said corresponding bit having a logic level depending on said divide factor, wherein the logic value received at said third input determines whether the frequency-dividing unit divides by a first factor or a second factor;
  a third input for receiving a mode control signal from said next frequency-dividing unit, wherein said mode control signal indicates when to use said second factor, instead of said first factor in dividing said input clock,
wherein the mode control signal received by the highest operative unit is fixed at a pre-defined logic level;
a divide-by-2 block coupled to receive a first signal from said cascade, said divide-by-2 block to generate a div-by-2 clock with a frequency half the frequency of said first signal;
a delay block to delay said div-by-2 clock by a half-cycle duration of said VCO clock to generate a delayed clock;
a combining circuit to receive said delayed clock and said div-by-2 clock, and to generate a combined clock; and
a multiplexer (MUX) to receive said combined clock and said div-by-2 clock, said MUX to provide said div-by-2 clock as said output clock if N is even, said MUX to provide said combined clock as said output clock if N is odd.

15. The PLL of claim 14, wherein said first signal is one of a mode control output generated in said cascade, and a clock output of a highest unit of said cascade,
  wherein if said input factor (N) is even, said logic block generates a first factor as said derived divide factor,
  wherein if said input factor (N) is odd, said logic block generates a second factor as said derived divide factor in a first duration, and a third factor as said derived divide factor in a second duration.

16. The PLL of claim 14, wherein said first signal is a mode control signal (MD0) generated by a lowest unit in said cascade,
  wherein said first factor is (N/2), said second factor is (N/2−(0.5)) and said third factor is (N/2+(0.5)).

17. The PLL of claim 16, wherein said delay block is implemented as a flip-flop clocked by said VCO clock.

18. The PLL of claim 16, wherein said combining circuit is an OR gate, wherein said VCO clock (Fvco) is generated in differential form comprising a pair of signals Fvco-p and Fvco-n, wherein the combination of said delay block, said OR gate and said MUX is implemented by a circuit comprising:
  a first flip-flop to receive said mode control signal (MD0), and to generate a first sampled signal in response to an active edge of Fvco-n;
  a second flip-flop to receive said first sampled signal, and to generate a second sampled signal in response to an active edge of Fvco-p;
  an inverter to receive a third signal indicating whether said divide factor (N) is even or odd, said inverter to provide a logical inverse of said third signal as an inverted output;
  a first NOR gate coupled to receive said first sampled signal and said third signal as inputs, and to generate a logical NOR of said first sampled signal and said third signal as a first NOR output;
  a second NOR gate coupled to receive said second sampled signal and said inverted output as inputs, and to generate a logical NOR of said second sampled signal and said inverted output as a second NOR output;
  a first pair of pull-up components, wherein a first terminal of each of said first pair of pull-up components is coupled to a first constant reference potential node;
  a second pair of transistors connected in series across a second terminal of the first pull-up component of said first pair and a second constant reference potential node, wherein control terminals of transistors in said second pair are respectively coupled to said second constant reference potential node and Fvco-n;
  a third pair of transistors connected in series across said second terminal of said first pull-up component of said first pair and said second constant reference potential node, wherein control terminals of transistors in said third pair are respectively coupled to said first sampled signal and Fvco-p;
  a fourth pair of transistors connected in series across a second terminal of the second pull-up component of said first pair and said second constant reference potential node, wherein control terminals of transistors in said fourth pair are respectively coupled to said first NOR output and Fvco-p; and
  a fifth pair of transistors connected in series across said second terminal of said second pull-up component of said first pair and said second constant reference potential node, wherein control terminals of transistors in said fifth pair are respectively coupled to said second NOR output and Fvco-n,
  wherein said output clock is generated at said second current terminal of the second pull-up component of said first pair.

19. A frequency divider circuit for dividing the frequency of an input clock by an input factor (N) to generate an output clock with a fifty-percent duty cycle, wherein N is an integer other than 0 and 1, said frequency divider circuit comprising:

a logic unit to receive said input factor and to determine if said input factor (N) is even or odd, said logic unit to provide ((N/2)−0.5) as a first derived divide factor and ((N/2)+0.5) as a second derived divide factor if said input factor is odd, said logic unit to provide (N/2) as both of said first derived divide factor and said second derived divide factor if said input factor is even;

a divider circuit to receive said input clock and to divide said input clock by said first derived factor in a first duration and by said second derived factor in a second duration to generate a mode control signal, wherein said second duration immediately follows said first duration;

a divide-by-two block to divide said mode control signal by two to generate a div-by-2 clock;

a delay block to delay said div-by-2 clock by a half-cycle duration of said input clock to generate a delayed clock;

a combining circuit to receive said delayed clock and said div-by-2 clock, and to generate a combined clock, wherein said combined block is said output clock with 50% duty cycle if N is determined to be odd; and a multiplexer (MUX) to receive said combined clock and said div-by-2 clock, said MUX to provide said div-by-2 clock as said output clock if N is even, said MUX to provide said combined clock as said output clock if N is odd.

20. The frequency divider circuit of claim 19, wherein said frequency divider circuit comprises a cascade of frequency dividing units, wherein each of said frequency dividing units is designed to divide by either 2 or 3, wherein said input signal is generated in differential form comprising a pair of signals Fvco-p and Fvco-n, wherein the combination of said delay block, said combining circuit and said MUX is implemented by a circuit comprising:

a first flip-flop to receive said mode control signal, and to generate a first sampled signal in response to an active edge of Fvco-n;

a second flip-flop to receive said first sampled signal, and to generate a second sampled signal in response to an active edge of Fvco-p;

an inverter to receive a third signal indicating whether said divide factor (N) is even or odd, said inverter to provide a logical inverse of said third signal as an inverted output;

a first NOR gate coupled to receive said first sampled signal and said third signal as inputs, and to generate a logical NOR of said first sampled signal and said third signal as a first NOR output;

a second NOR gate coupled to receive said second sampled signal and said inverted output as inputs, and to generate a logical NOR of said second sampled signal and said inverted output as a second NOR output;

a first pair of pull-up components, wherein a first terminal of each of said first pair of pull-up components is coupled to a first constant reference potential node;

a second pair of transistors connected in series across a second terminal of the first pull-up component of said first pair and a second constant reference potential node, wherein control terminals of transistors in said second pair are respectively coupled to said second constant reference potential node and Fvco-n;

a third pair of transistors connected in series across said second terminal of said first pull-up component of said first pair and said second constant reference potential node, wherein control terminals of transistors in said third pair are respectively coupled to said first sampled signal and Fvco-p;

a fourth pair of transistors connected in series across a second terminal of the second pull-up component of said first pair and said second constant reference potential node, wherein control terminals of transistors in said fourth pair are respectively coupled to said first NOR output and Fvco-p; and a fifth pair of transistors connected in series across said second terminal of said second pull-up component of said first pair and said second constant reference potential node, wherein control terminals of transistors in said fifth pair are respectively coupled to said second NOR output and Fvco-n, wherein said output clock is generated at said second current terminal of the second pull-up component of said first pair.

* * * * *